(12) United States Patent
Freebern

(10) Patent No.: US 7,082,049 B2
(45) Date of Patent: Jul. 25, 2006

(54) RANDOM ACCESS MEMORY HAVING FAST COLUMN ACCESS

(75) Inventor: Margaret Freebern, Richmond, VA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/993,250

(22) Filed: Nov. 19, 2004

(65) Prior Publication Data

US 2006/0109721 A1 May 25, 2006

(51) Int. Cl.
*G11C 11/24* (2006.01)
(52) U.S. Cl. .................... 365/149; 365/230.03
(58) Field of Classification Search ........... 365/230.03, 365/149
See application file for complete search history.

(56) References Cited

U.S. PATENT DOCUMENTS

| | | | |
|---|---|---|---|
| 4,764,901 A | 8/1988 | Sakurai et al. | |
| 5,544,124 A | 8/1996 | Zager et al. | |
| 5,636,174 A * | 6/1997 | Rao | 365/230.03 |
| 5,754,838 A * | 5/1998 | Shibata et al. | 713/600 |
| 6,151,269 A * | 11/2000 | Dosaka et al. | 365/233 |
| 6,785,187 B1 | 8/2004 | Fujimoto et al. | |

* cited by examiner

*Primary Examiner*—Michael Tran
(74) *Attorney, Agent, or Firm*—Dicke, Billig & Czaja, PLLC

(57) ABSTRACT

A memory comprises a column decoder and a circuit. The circuit is configured to receive a column address strobe signal, a column active signal, and a column addresses signal. The circuit is configured to pass the column addresses signal to the column decoder if the column address strobe signal and the column active signal are at a first logic level, and latch the column addresses signal and pass the latched column addresses signal to the column decoder if one of the column address strobe signal and the column active signal are at a second logic level different from the first logic level.

19 Claims, 3 Drawing Sheets

RANDOM ACCESS MEMORY HAVING FAST COLUMN ACCESS

BACKGROUND

One type of memory known in the art is Dynamic Random Access Memory (DRAM). One type of DRAM is Pseudo Static Random Access Memory (PSRAM). PSRAM is a low power DRAM having a Static Random Access Memory (SRAM) interface for wireless applications. In general, DRAM includes at least one array of memory cells. The memory cells in the array of memory cells are arranged in rows and columns, with the rows extending along an x-direction and the columns extending along a y-direction. Conductive word lines extend across the array of memory cells along the x-direction and conductive bit lines extend across the array of memory cells along the y-direction. A memory cell is located at each cross point of a word line and a bit line. Memory cells are accessed using a row address and a column address.

DRAM uses a main clock signal and a data strobe signal (DQS) for addressing the array of memory cells and for executing commands within the memory. The clock signal is used as a reference for the timing of commands such as read and write operations, including address and control signals. The DQS signal is used as a reference to latch input data into the memory and output data into an external device.

A Column Address Strobe (CAS) signal is used to latch in the Column Addresses (CADD) for selected memory cells and initiate a column access during a read or write operation. Typically, the column addresses are latched and passed for decoding on the rising edge of the CAS signal. Therefore, any address set up time (i.e., the time the addresses are valid before the CAS signal rises) is wasted. The CAS signal, which functions as a clock for the column path, must not initiate a column access before the column addresses are latched and decoded. Initiating a column access before the column addresses are latched and decoded can cause several problems, such as the activation of an incorrect column element, which in turn would result in reading incorrect data. To prevent reading incorrect data, the CAS signal is typically delayed in the column path until the addresses are latched and decoded and have performed the necessary logic switches in the column. Delaying the CAS signal in the column path slows down read and write accesses to the memory.

SUMMARY

One embodiment of the present invention provides a memory. The memory comprises a column decoder and a circuit. The circuit is configured to receive a column address strobe signal, a column active signal, and a column addresses signal. The circuit is configured to pass the column addresses signal to the column decoder if the column address strobe signal and the column active signal are at a first logic level, and latch the column addresses signal and pass the latched column addresses signal to the column decoder if one of the column address strobe signal and the column active signal are at a second logic level different from the first logic level.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
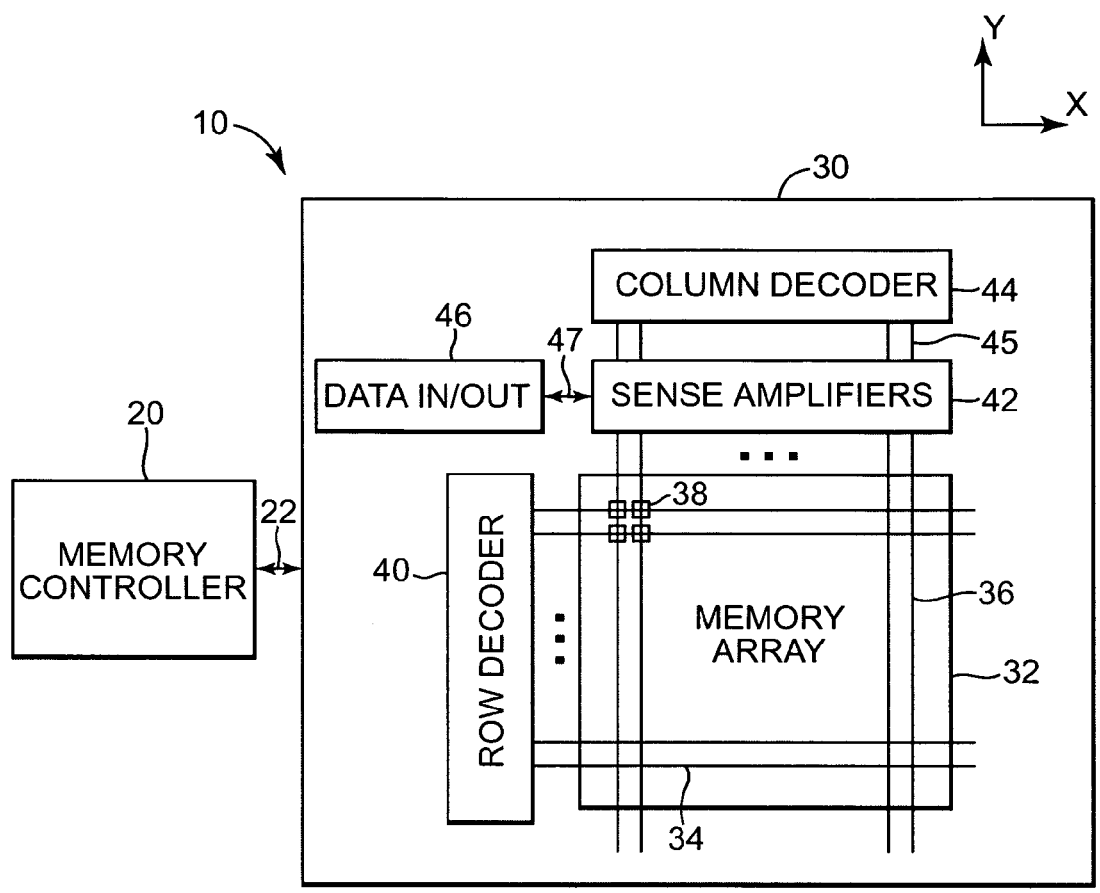
FIG. 1 is a block diagram illustrating one embodiment of a random access memory, according to the present invention.

FIG. 1 is a block diagram illustrating one embodiment of a random access memory 10. In one embodiment, random access memory 10 is a pseudo static random access memory (PSRAM). PSRAM 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30, indicated at 22.

PSRAM 10 includes a circuit configured to receive column addresses from memory controller 20 and pass the column addresses to column decoder 44 for decoding. With the column addresses decoded, the circuit receives a column addresses strobe (CAS) signal. In response to the CAS signal, the column addresses are latched and data is read from or written to the array of memory cells 32 at the specified column addresses. The CAS signal is not delayed in the column path since the column addresses are decoded before the CAS signal arrives. A column active signal transitions to a logic high in response to the rising edge of the CAS signal and transitions to a logic low after the read or write operation is completed. The next column addresses from memory controller 20 are not passed to column decoder 44 by the circuit until the CAS signal is at a logic low and the column active signal is at a logic low.

Conductive word lines 34, referred to as row select lines, extend in the x-direction across the array of memory cells 32. Conductive bit lines 36, referred to as column select lines, extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
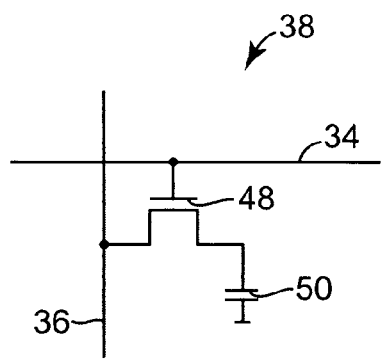
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic 0 or a logic 1. During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In one embodiment, random access memory 10 is a double data rate synchronous dynamic random access memory (DDR SDRAM). In DDR SDRAM, the read and write operations are synchronized to a system clock. The system clock is supplied by a host system that includes the DDR SDRAM. DDR SDRAM operates from a differential clock, CK and bCK. The crossing of CK going high and bCK going low is referred to as the positive edge of CK. Commands such as read and write operations, including address and control signals, are registered at the positive edge of CK. Operations are performed on both the rising and falling edges of the system clock.

The DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

Read and write accesses to the DDR SDRAM are burst oriented. Accesses start at a selected location and continue for a programmed number of locations in a programmed sequence. Accesses begin with the registration of an activate command, which is followed by a read or write command. The address bits registered coincident with the active command are used to select the bank and row to be accessed. The address bits registered coincident with the read or write command are used to select the bank and the starting column location for the burst access.

The DDR SDRAM in the preceding description is referred to as DDR-I SDRAM for being the first generation of DDR SDRAM. The next generation of DDR SDRAM, DDR-II SDRAM has the same features as DDR-I SDRAM except that the data rate is doubled. The DDR-II SDRAM architecture is essentially a 4n prefetch architecture with an interface designed to transfer four data words per clock cycle at the DQs. A single read or write access for the DDR-II SDRAM effectively consists of a single 4n bit wide, one clock cycle data transfer at the internal memory array and four corresponding n bit wide, one quarter clock cycle data transfers at the DQs. In one embodiment, random access memory 10 is a DDR-II SDRAM.

In another embodiment, random access memory 10 is a PSRAM. One type of PSRAM is CellularRAM, which is adapted for wireless applications. CellularRAM is a drop-in replacement for static random access memory (SRAM) and is based on a single transistor DRAM cell versus a six transistor SRAM cell.

Figure 3:
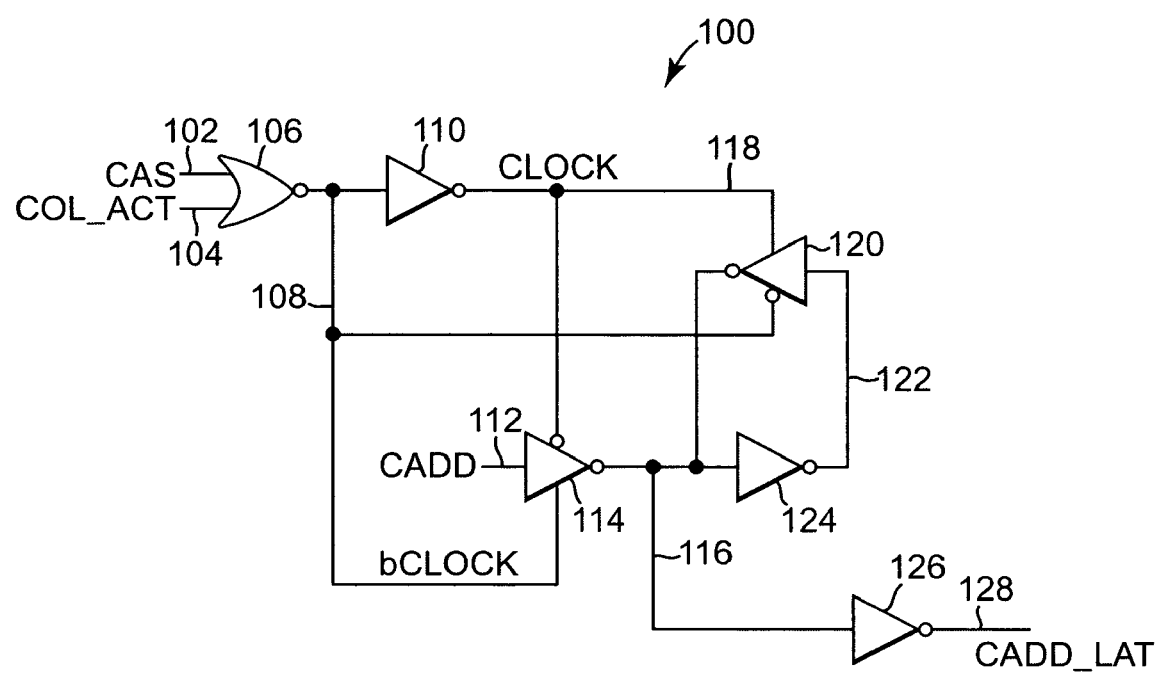
FIG. 3 is a diagram illustrating one embodiment of a portion of the random access memory for latching column addresses.

FIG. 3 is a diagram illustrating one embodiment of a portion 100 of random access memory 10 for latching column addresses. In one embodiment, portion 100 is part of column decoder 44. Portion 100 includes NOR gate 106, inverters 110, 124, and 126, and inverting tri-state buffers 114 and 120. A first input of NOR gate 106 receives a CAS signal on CAS signal path 102, and a second input of NOR gate 106 receives a column active (COL_ACT) signal on COL_ACT signal path 104. The output of NOR gate 106 is electrically coupled to the input of inverter 110, the active low enable input of inverting tri-state buffer 120, and the active high enable input of inverting tri-state buffer 114 through bCLOCK signal path 108.

The output of inverter 110 is electrically coupled to the active high enable input of inverting tri-state buffer 120 and the active low enable input of inverting tri-state buffer 114 through CLOCK signal path 118. The input of inverting tri-state buffer 114 receives the column addresses (CADD) signal on CADD signal path 112. The output of inverting tri-state buffer 114 is electrically coupled to the input of inverter 124, the input of inverter 126, and the output of inverting tri-state buffer 120 through signal path 116. The output of inverter 124 is electrically coupled to the input of inverting tri-state buffer 120 through signal path 122. The output of inverter 126 provides the column addresses latched (CADD_LAT) signal on CADD_LAT signal path 128.

With a logic low CAS signal on CAS signal path 102 and a logic low COL_ACT signal on COL_ACT signal path 104, NOR gate 106 outputs a logic high bCLOCK signal on bCLOCK signal path 108. With a logic high CAS signal on CAS signal path 102 or a logic high COL_ACT signal on COL_ACT signal path 104, NOR gate 106 outputs a logic low bCLOCK signal on bCLOCK signal path 108. Inverter 110 inverts the bCLOCK signal to provide the CLOCK signal on CLOCK signal path 118.

With a logic high bCLOCK signal on bCLOCK signal path 108 and a logic low CLOCK signal on CLOCK signal path 118, inverting tri-state buffer 114 is enabled and passes and inverts the CADD signal on CADD signal path 112 to signal path 116. With a logic low bCLOCK signal on bCLOCK signal path 108 and a logic high CLOCK signal on CLOCK signal path 118, inverting tri-state buffer 114 is disabled and its output is high impedance.

With a logic high CLOCK signal on CLOCK signal path 118 and a logic low bCLOCK signal on bCLOCK signal path 108, inverting tri-state buffer 120 is enabled and passes and inverts the signal on signal path 122 to signal path 116. With the CLOCK signal on CLOCK signal path 118 at a logic low and the bCLOCK signal on bCLOCK signal path 108 at a logic high, inverting tri-state buffer 120 is disabled and its output is high impedance.

Inverter 124 inverts the signal on signal path 116 to provide the signal on signal path 122. With inverting tri-state buffer 120 enabled, inverter 124 and inverting tri-state buffer 120 latch the signal on signal path 116. Inverter 126 inverts the signal on signal path 116 to provide the CADD_LAT signal on CADD_LAT signal path 128.

In operation, with a logic low CAS signal on CAS signal path 102 from memory controller 20 and a logic low COL_ACT signal on COL_ACT signal path 104, the output of NOR gate 106 provides a logic high bCLOCK signal on bCLOCK signal path 108. The logic high bCLOCK signal is inverted by inverter 110 to provide a logic low CLOCK signal on CLOCK signal path 118. With the bCLOCK signal at a logic high and the CLOCK signal at a logic low, inverting tri-state buffer 114 is enabled and inverting tri-state buffer 120 is disabled. Inverting tri-state buffer 114 passes and inverts the CADD signal to signal path 116. The inverted CADD signal on signal path 116 is further inverted by inverter 126 to provide the CADD_LAT signal on CADD_LAT signal path 128. The CADD_LAT signal is passed to column decoder 44 where the column addresses are decoded and column logic switches are switched to select the columns specified by the column addresses.

Memory controller 20 then transitions the CAS signal on CAS signal path 102 to a logic high. In response to the CAS signal transitioning to a logic high, the COL_ACT signal on COL_ACT signal path 104 also transitions to a logic high. In response to the CAS signal transitioning to a logic high, the output of NOR gate 106 transitions the bCLOCK signal on bCLOCK signal path 108 to a logic low. The logic low bCLOCK signal is inverted by inverter 110 to transition the CLOCK signal on CLOCK signal path 118 to a logic high.

With the CLOCK signal at a logic high and the bCLOCK signal at a logic low, inverting tri-state buffer 114 is disabled and inverting tri-state buffer 120 is enabled. The inverted CADD signal on signal path 116 is latched by inverter 124 and inverting tri-state buffer 120. The inverted CADD signal is inverted by inverter 126 to provide the CADD_LAT signal on CADD_LAT signal path 128.

The COL_ACT signal remains logic high until the read or write operation is complete. The COL_ACT signal prevents the next CADD signal on CADD signal path 112 from entering the latch. Therefore, the next CADD signal cannot begin decoding before the previous read or write operation is completed. With the current read or write operation completed, the COL_ACT signal transitions to a logic low. With the CAS signal also at a logic low, inverting tri-state buffer 114 is then enabled and inverting tri-state buffer 120 is disabled. The next CADD signal is passed and inverted by inverting tri-state buffer 114 to signal path 116 to begin the next read or write operation.

Figure 4:
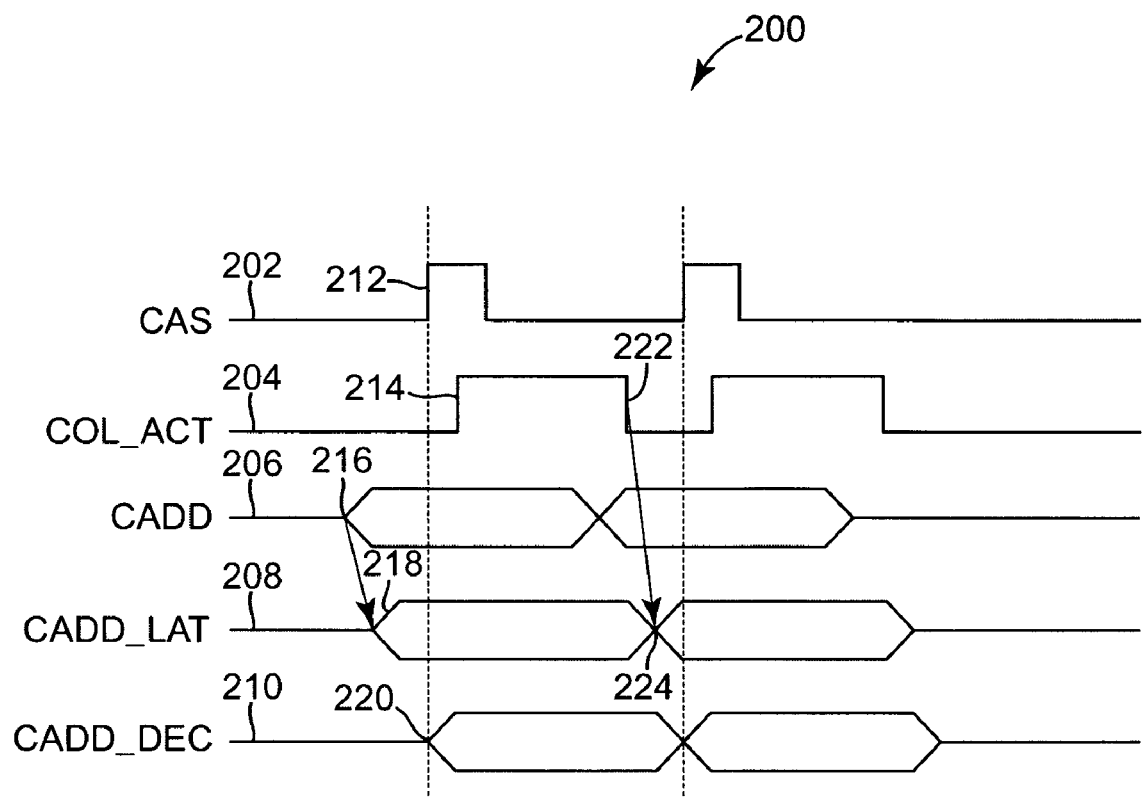
FIG. 4 is a timing diagram illustrating one embodiment of the timing of signals for latching column addresses in the random access memory.

FIG. 4 is a timing diagram 200 illustrating one embodiment of the timing of signals for portion 100 of random access memory 10. Timing diagram 200 includes CAS signal 202 on CAS signal path 102, COL_ACT signal 204 on COL_ACT signal path 104, CADD signal 206 on CADD signal path 112, CADD_LAT signal 208 on CADD_LAT signal path 128, and column addresses decoded (CADD_DEC) signal 210.

With CAS signal 202 at a logic low and COL_ACT signal 204 at a logic low, CADD signal 206 is received at 216 and passed and inverted by inverting tri-state buffer 114 and inverter 126 to provide CADD_LAT signal 208 at 218. CADD_LAT signal 208 is decoded by column decoder 44 to provide CADD_DEC signal 210 at 220. The addressed columns are selected based on the column addresses. In response to rising edge 212 of CAS signal 202, COL_ACT signal 204 transitions to a logic high at 214. Also in response to rising edge 212 of CAS signal 202, data is read from or written to the addressed columns of the array of memory cells 32.

COL_ACT signal 204 remains logic high until the read or write operation is completed. Falling edge 222 of COL_ACT signal 204 indicates the read or write operation is completed. In response to falling edge 222 of COL_ACT signal 204, inverting tri-state buffer 114 is enabled and inverting tri-state buffer 120 is disabled. Inverting tri-state buffer 114 and inverter 126 pass and invert CADD signal 206 to provide CADD_LAT signal 208, as indicated at 224, to begin the next read or write operation.

The embodiments of this invention take advantage of the CADD signal setup time to begin the column address decoding before memory controller 20 provides the CAS signal, thus preventing the need to delay the CAS signal in the column path while the CADD signal is decoded. By not delaying the CAS signal, column accesses to random access memory 10 are quicker, enabling faster read and write times.

What is claimed is:

1. A memory comprising:
   a column decoder; and
   a circuit configured to:
   receive a column address strobe signal, a column active signal, and a column addresses signal;
   pass the column addresses signal to the column decoder if the column address strobe signal and the column active signal are at a first logic level; and
   latch the column addresses signal and pass the latched column addresses signal to the column decoder if one of the column address strobe signal and the column active signal are at a second logic level different from the first logic level.

2. The memory of claim 1, further comprising:
   an array of memory cells coupled to the column decoder.

3. The memory of claim 2, wherein the memory cells comprise dynamic random access memory cells.

4. The memory of claim 1, wherein the first logic level comprises a logic low level and the second logic level comprises a logic high level.

5. The memory of claim 1, further comprising:
   a memory controller configured to provide the column addresses signal.

6. A random access memory comprising:
   a latching circuit configured to receive a column address strobe signal, a column active signal, and a column addresses signal, the latching circuit comprising:
   a first tri-state buffer configured to pass the column addresses signal in response to a first logic level of the column address strobe signal and a first logic level of the column active signal; and a second tri-state buffer configured to latch the column addresses signal in response to a second logic level of the column address strobe signal; and a column decoder coupled to the latching circuit, the column decoder configured to decode the column addresses signal passed from the first tri-state buffer.

7. The random access memory of claim 6, wherein the column decoder is configured to decode the column addresses signal passed from the first tri-state buffer before the column address strobe signal transitions from the first logic level to the second logic level.

8. The random access memory of claim 6, further comprising:

an array of memory cells coupled to the decoder circuit.

9. The random access memory of claim 8, further comprising:

a memory controller coupled to the latching circuit, the memory controller configured to provide the column address strobe signal and the column addresses signal.

10. The random access memory of claim 9, wherein the memory controller, the latching circuit, the decoder, and the array of memory cells are configured to provide a dynamic random access memory.

11. The random access memory of claim 9, wherein the memory controller, the latching circuit, the decoder, and the array of memory cells are configured to provide a pseudo static random access memory.

12. The random access memory of claim 9, wherein the memory controller, the latching circuit, the decoder, and the array of memory cells are configured to provide a cellular random access memory.

13. The random access memory of claim 9, wherein the memory controller, the latching circuit, the decoder, and the array of memory cells are configured to provide a synchronous dynamic random access memory.

14. The random access memory of claim 9, wherein the memory controller, the latching circuit, the decoder, and the array of memory cells are configured to provide a double data rate synchronous dynamic random access memory.

15. A random access memory comprising:

means for receiving a column address strobe signal;

means for receiving a column active signal;

means for passing a column addresses signal to a column decoder if the column address strobe signal and the column active signal are at a first logic level; and means for latching the column addresses signal and passing the latched column addresses signal to the column decoder if one of the column address strobe signal and the column active signal are at a second logic level different from the first logic level.

16. A method for decoding a column addresses signal in a random access memory, the method comprising:

receiving a column address strobe signal;

receiving a column active signal;

receiving a column addresses signal;

passing the column addresses signal to a column decoder if the column address strobe signal and the column active signal are at a first logic level; and latching the column addresses signal and passing the latched column addresses signal to the column decoder if one of the column address strobe signal and the column active signal are at a second logic level different from the first logic level.

17. The method of claim 16, further comprising:

transitioning the column active signal to the second logic level in response to the column address strobe signal transitioning to the second logic level; and transitioning the column active signal to the first logic level in response to one of a completed read operation and a completed write operation.

18. A method for performing one of a read and write operation on a random access memory, the method comprising:

receiving a column addresses signal from a memory controller;

passing the column addresses signal to a column decoder;

decoding the column addresses signal;

receiving a column address strobe signal from the memory controller;

latching the column addresses signal in response to the column address strobe signal;

one of reading data from and writing data to an array of memory cells at the column addresses in response to the column address strobe signal without delaying the column address strobe signal;

providing a column active signal at a first logic level in response to the column address strobe signal; and maintaining the latch of the column addresses signal until the column active signal transitions to a second logic level different from the first logic level, wherein the column active signal transitions to the second logic level in response to one of a completed read operation and a completed write operation.

19. A method for performing one of a read and write operation on a random access memory the method comprising:

receiving a column addresses signal from a memory controller;

passing the column addresses signal to a column decoder;

decoding the column addresses signal;

receiving a column address strobe signal from the memory controller;

latching the column addresses signal in response to the column address strobe signal; and one of reading data from and writing data to an array of memory cells at the column addresses in response to the column address strobe signal without delaying the column address strobe signal, wherein decoding the column addresses signal comprises switching logic switches based on the column addresses signal to select columns of an array of memory cells.

* * * * *